US007365434B2

(12) United States Patent
Aiba

(10) Patent No.: US 7,365,434 B2
(45) Date of Patent: Apr. 29, 2008

(54) SEMICONDUCTOR DEVICE AND MANUFACTURING METHOD FOR THE SAME

(75) Inventor: Yoshitaka Aiba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 8 days.

(21) Appl. No.: 11/441,067

(22) Filed: May 26, 2006

(65) Prior Publication Data
US 2007/0194445 A1 Aug. 23, 2007

(30) Foreign Application Priority Data
Feb. 6, 2006 (JP) .............................. 2006-028850

(51) Int. Cl.
H01L 29/40 (2006.01)
(52) U.S. Cl. .................. 257/773; 257/784; 257/774; 257/734; 438/125
(58) Field of Classification Search ............... 257/734, 257/737, 739, 750, 759, 758, 773, 774, 778, 257/779, 780, 781, 784, 786
See application file for complete search history.

(56) References Cited

U.S. PATENT DOCUMENTS 5,215,863 A * 6/1993 Nawata et al. ........... 430/280.1
2003/0218246 A1 11/2003 Abe et al.
2004/0004293 A1 * 1/2004 Murayama ................. 257/780

FOREIGN PATENT DOCUMENTS

JP 2002-280486 9/2002
JP 2004-22653 1/2004

OTHER PUBLICATIONS

Chinese Office Action dated Jan. 4, 2008, issued in corresponding Chinese patent application No. 200610094071.8.

* cited by examiner

Primary Examiner—Zandra V. Smith
Assistant Examiner—Paul E Patton
(74) Attorney, Agent, or Firm—Westerman, Hattori, Daniels & Adrian, LLP.

(57) ABSTRACT

To provide a semiconductor device with high performance and reliability, in which peeling off an interconnection layer caused due to peeling off of a resin film at a land part is suppressed and thus electrical break down is prevented, and an efficient method for manufacturing the semiconductor device. The semiconductor device includes a semiconductor substrate (e.g., a silicon wafer 10); an insulating film 12 formed on the semiconductor substrate 10; a conductive layer 20 formed on the insulating film 12, the conductive layer 20 formed of an interconnection part 22 and a land part 24 which connects the interconnection part 22 to an external terminal 40; and a resin film 30 covering the conductive layer 20, wherein the resin film 30 is in contact with the insulating film 12 at least at a part of the land part 24 by passing through the conductive layer 20.

18 Claims, 10 Drawing Sheets

SEMICONDUCTOR DEVICE AND MANUFACTURING METHOD FOR THE SAME

CROSS-REFERENCE TO RELATED APPLICATIONS

This application is based upon and claims the benefits of the priority from the prior Japanese Patent Application No. 2006-028850 filed on Feb. 6, 2006, the entire contents of which are incorporated herein by reference.

BACKGROUND OF THE INVENTION

1. Field of the Invention

The present invention relates to a semiconductor device with high performance and reliability, in which peeling off an interconnection layer caused due to peeling off of a resin film at a land part is suppressed and thus electrical break down is prevented, and an efficient method for manufacturing the semiconductor device.

2. Description of the Related Art

Attempts have been made in recent years to achieve downsizing and greater packaging density of semiconductor devices, with the trend moving toward for thinner, smaller electronic devices. Against this background, wafer level packaging has been proposed, which aims to achieve downsizing by minimizing the semiconductor device to the size of the semiconductor element (chip) as much as possible. A wafer level package is one in which the semiconductor chip and package are fabricated on the wafer prior to singulation, thereby enabling real chip size packaging at low cost compared to conventional packaging. Meanwhile, when high pin count and miniaturization of the semiconductor device are achieved as a result of increased density, it results in narrow pitch between adjacent external terminals. For this reason, wafer level packaging also adopts a configuration that uses bumps (electrodes) rather than pillar-shaped bumps, allowing relatively many external terminals to be formed in a small space. In addition, a wafer level package with a simple structure, in which interconnections are covered with resin, has been proposed (see Japanese Patent Application Laid-Open (JP-A) No. 2002-280486 and 2004-22653).

However, the simpler the semiconductor device structure, the more outstanding the problem of poor adhesion between different components. More specifically, many of interconnections are made of copper, which is known to be less adhesive to resin. At a land part of the semiconductor device, formed by providing an opening in the resin film on an interconnection, the end of the resin film is exposed. Thus, there is a problem that it is likely that the end of the resin film is peeled off due to poor adhesion between the interconnection and resin film. The adhesion between the interconnection and resin film is susceptible to environmental conditions—the resin film is easily peeled off under heat and stress. For example, when the semiconductor device is subjected to a high-low temperature cycle test as a reliability evaluation test, the resin film opening is degraded to cause peeling off the resin film, which sometimes leads to peeling off of the interconnection.

Semiconductor devices with high performance and reliability have yet been provided, in which peeling off an interconnection layer caused due to peeling off of a resin film at a land part is suppressed.

It is an object of the present invention to solve the foregoing problems and to achieve objects described below. Specifically, it is an object of the present invention to provide a semiconductor device with high performance and reliability, in which peeling off an interconnection layer caused due to peeling off of a resin film at a land part is suppressed and thus electrical break down is prevented, and an efficient method for manufacturing the semiconductor device.

SUMMARY OF THE INVENTION

The semiconductor device of the present invention includes a semiconductor substrate; an insulating film formed on the semiconductor substrate; a conductive layer formed on the insulating film, the conductive layer formed of an interconnection part and a land part which connects the interconnection part to an external terminal; and a resin film covering the conductive layer, wherein the resin film is in contact with the insulating film at least at a part of the land part by passing through the conductive layer.

In the semiconductor device the surface of the insulating film is in (intimate) contact with the resin film at least at a part of the land part. In contrast to a semiconductor device that adopts a structure in which the resin film which generally has low compatibility with the conductive layer is not in contact with the insulating layer for the bonding of the conductive layer and insulating layer, this semiconductor device adopts a structure in which the resin film—a film with high compatibility with the insulating film—is allowed to contact the surface of the insulating film by passing through the conductive layer. For this reason, in this semiconductor device the conductive layer is firmly secured to the semiconductor substrate and peeling off of the resin film end (i.e., the end of the resin film from which at least a part of the conductive layer within the land part is exposed) from the opening above the land part can be suppressed. Thus, the semiconductor device of the present invention is of high performance and reliability and is suitable for wafer level packages.

The method of the present invention for forming a semiconductor device is one for forming the semiconductor device of the present invention. The method of the present invention includes forming an insulating film on a semiconductor substrate; forming a conductive layer on the semiconductor substrate, the conductive layer formed of an interconnection part and a land part which connects the interconnection part to an external terminal; forming through holes in the conductive layer at least within a part of the land part; and forming a resin film on the conductive layer in such a way that the resin film passes through the through holes to thereby allow the insulating layer to contact the resin film.

With this method, an insulating film is first formed on a semiconductor substrate. Next, a conductive layer, which is formed of an interconnection part and a land part connecting the interconnection part to an external terminal, is formed on the insulating layer, and through holes are formed in the conductive layer at least within a part of the land part. A resin film is then formed in such a way that it passes through the through holes to thereby allow the insulating layer to contact the resin film. In this way the surface of the insulating film is in (intimate) contact with the resin film at least at a part of the land part. In contrast to a semiconductor device that adopts a structure in which the resin film which generally has low compatibility with the conductive layer is not in contact with the insulating layer for the bonding of the conductive layer and insulating layer, the semiconductor device manufactured with this method has a structure in which the resin film—a film with high compatibility with the insulating film—is allowed to contact the surface of the insulating film by passing through the conductive layer. For this reason, in this semiconductor device, the conductive layer is firmly secured to the semiconductor substrate and peeling off of the resin film end (i.e., the end of the resin film from which at least a part of the conductive layer within the land part is exposed) from the opening above the land part can be suppressed. Thus, with this method of the present invention, it is possible to manufacture a semiconductor device of high performance and reliability.

DESCRIPTION OF THE PREFERRED EMBODIMENTS

Hereinafter, the semiconductor device of the present invention and the manufacturing method for the same will be described with reference to Examples, which however shall not be construed as limiting the invention thereto.

EXAMPLE 1

Figure 1A:
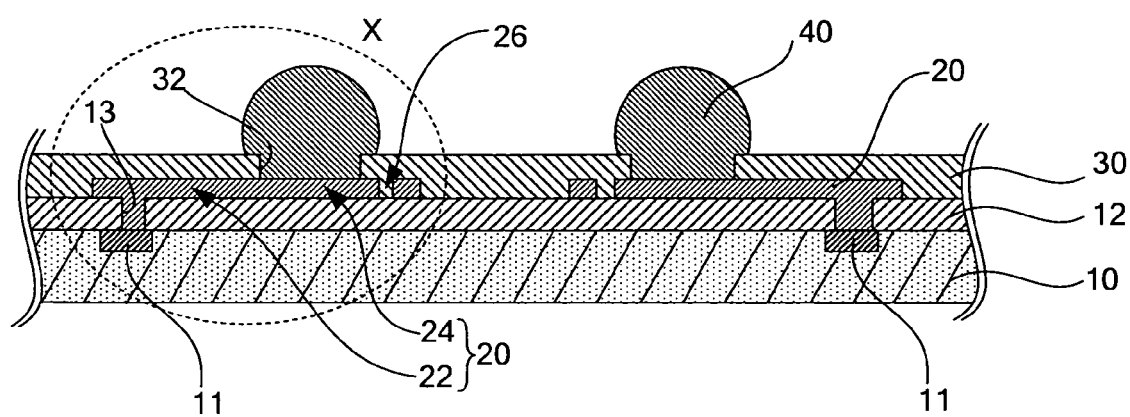
FIG. 1A is a vertical cross sectional view taken along A-A' line of FIG. 1B, showing the First Example (Example 1) of a semiconductor device of the present invention.
Figure 1B:
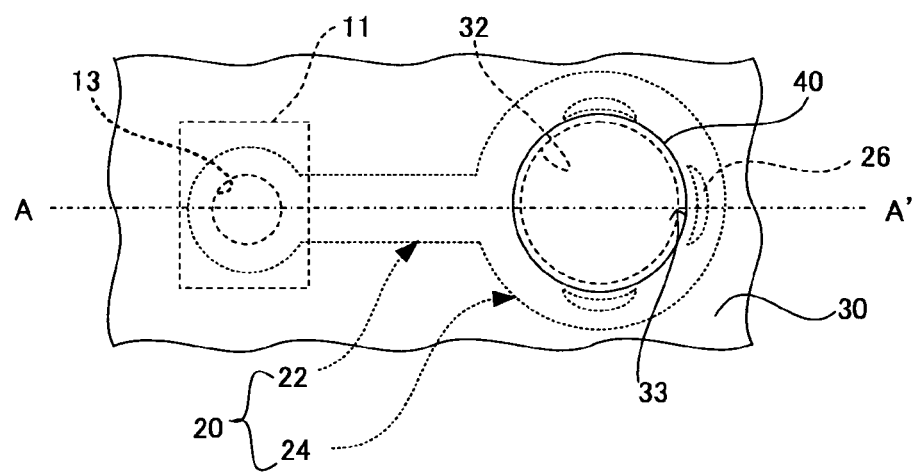
FIG. 1B is a top view of "X" portion encircled by dotted line in FIG. 1A, showing the First Example (Example 1) of the semiconductor device of the present invention.

The First Example of the semiconductor device of the present invention is shown in FIGS. 1A and 1B. FIG. 1A is a cross-sectional view taken along A-A' line of FIG. 1B, and FIG. 1B is a top view of "X" portion encircled by dotted line of FIG. 1A.

In the semiconductor device shown in FIG. 1A, an insulating film 12 made of, for example, polyimide resin, is formed on a silicon wafer 10 which has Al pads 11 and serves as the foregoing semiconductor substrate. The insulating film 12 is placed in such a way as to avoid spaces above the Al pads 11, where connection holes 13 are to be provided.

A conductive layer (or interconnection) 20 made of copper is provided on the surface of the insulating film 12, filling the connection holes 13. The Al pad 11 and conductive layer 20 are bonded together via the connection hole 13. The conductive layer 20 is formed of an interconnection part 22 and a land part 24. As shown in FIG. 1B, three through holes 26 passing through the conductive layer 20 are formed above the land part 24, whereby the insulating film 12 is exposed through the through holes 26.

A resin film 30 made of, for example, polyimide resin is formed on the insulating film 12 and on the conductive layer 20, and an opening 32 is provided in the resin film 30 at least above the land part 24. The resin film 30 enters the through holes 26, passing through the conductive layer 20 and contacting the insulating film 12 to firmly bonds to it. With this configuration, peeling off of the end 33 of the resin film 30 at the opening 32 is prevented.

A solder ball 40—the foregoing external terminal—is formed on in resin film opening 32 provided above the land part 24. The external terminal (solder ball 40) and the interconnection part 22 are connected together at the land part 24. In addition, the interconnection part 22 and the Al pad (electrode) 11 are connected together there, and electrical continuity is established between them.

In the semiconductor device of Example 1 the resin film 30 formed inside the through holes 26 contacts the insulating film 12 by passing through the conductive layer 20, and both the resin film 30 and insulating film 12 are made of polyimide resin. For these reasons, the resin film 30 and insulating film 12 are firmly bonded together with excellent adhesion. With this configuration, even when the end 33 of the resin film 30 at the opening 32 has somewhat been peeled off from the conductive layer 20 because of poor adhesion between them, the degree of peeling is not increased any more because the resin film 30 is brought into intimate contact with the insulating film 12 by passing through the through holes 26. Thus, it is possible to secure the conductive layer 20 to the insulating film 12 with reliability. Note that fields to which the semiconductor device of the present invention is applied is not particularly limited, and can be suitably selected depending on the intended purpose; for example, the semiconductor device of the present invention can be applied to general semiconductor chips and the like, particularly to wafer level packages, for example.

In the semiconductor devices in Example 1 and other Examples to be described later, the foregoing semiconductor substrate is not limited to the foregoing silicon wafer and can be appropriately selected from insulating substrates (e.g., glass epoxy substrates, polyester substrates, polyimide substrates, bismaleimide-triazine resin substrates, thermosetting polyphenyleneether substrates, fluorine resin substrates, ceramic substrates, copper clad laminates, and resin coated copper (RCC) foil substrates), depending on the manufacturing conditions and use conditions.

The insulating film 12 is not particularly limited; the constituent material, shape, structure, size, thickness and the like can be appropriately determined depending on the intended purpose. The insulating film 12 may be made either of insulating inorganic materials or insulating organic materials. However, insulating organic materials are preferable in view of their capability of providing excellent adhesion to the resin film 30.

The insulating inorganic materials are not particularly limited and can be appropriately selected depending on the intended purpose. For example, SiN or the like can be suitably adopted if the foregoing semiconductor substrate is a silicon wafer. In this case, the resin film 30 formed inside the through holes 26 is brought into intimate contact with the insulating film 12 made of SiN by passing through the conductive layer 20.

The insulating organic materials are not particularly limited and can be appropriately selected depending on the intended purpose; those with low permittivity and high heat resistance are preferable. In addition to the foregoing polyimide resins, polyamide resins, epoxy resins, polybenzoxazole resins, benzocyclobutene resins and the like can be adopted. These resins may be used singly or in combination. For the materials of the insulating film used in a wafer level package, polyimide resins, polyamide resins, epoxy resins and the like are preferable in view of their excellent heat resistance, handling ability, and quality performance in wafer processes.

The thickness of the insulating film 12 is not particularly limited and can be appropriately determined depending on the intended purpose; for example, when used in a wafer level package, it is preferably 2 µm to 20 µm, more preferably 5 µm to 15 µm. If the thickness of the insulating film 12 is less than 2 µm, the insulating film 12 becomes brittle and overall stress due to the differences in the degree of thermal expansion among the semiconductor substrate 10, conductive layer 20 and resin film 30 places stress on the insulating film 12, causing defects in the insulating film 12 in some cases. Whereas if the thickness of the insulating film 12 is greater than 20 µm, the aspect ratio between the opening diameter of the connection holes 13, which are formed in the insulating film 12 to connect electrodes to interconnections (or the conductive layer 20), and the thickness of the insulating film 12 becomes high, resulting in the increase in the likelihood of faulty connection holes 13 in the insulating film 12 and/or poorly-plated connection holes 13 in some cases.

The resin film 30 is not particularly limited; the constituent material, shape, structure, size, thickness and the like can be appropriately determined depending on the intended purpose. The resin film 30 preferably serves as a cover film for protecting the interconnection part 22 and land part 24.

The materials for the resin film 30 are not particularly limited and can be appropriately determined depending on the intended purpose; suitable examples thereof include, in addition to polyimide resins, polyamide resins, epoxy resins, polybenzoxazole resins and benzocyclobutene resins, because they all have insulation properties, low permittivity and high heat resistance. These resins may be used singly or in combination. For the materials of the insulating film used in a wafer level package, polyimide resins, polyamide resins, epoxy resins and the like are preferable in view of their excellent heat resistance, handling ability, and quality performance in wafer processes.

The resin film 30 is preferably made of the same material as the insulating film 12. In this case, the adhesion between the insulating film 12 and the resin film 30 is increased, suppressing peeling off the end 33 of the resin film 30 above the land part 24 (where the resin film opening 32 is provided).

The thickness of the resin film 30 is not particularly limited and can be appropriately determined depending on the intended purpose; when used as a cover film in a wafer level package, the thickness of the resin film 30 can be appropriately determined in light of the thickness of the conductive layer 20. For example, the resin film 30 is preferably about twice as thick as the conductive layer 20. The thickness of the resin film 30 is preferably 5 µm to 20 µm when the thickness of the conductive layer 20 is 3 µm to 10 µm. If the resin film 30 is made too thin, it becomes brittle, and stress due to the difference in the degree of thermal expansion between the conductive layer 20 and resin film 30 may cause cracks in the resin film 30. Whereas if the thickness of the resin film 30 is greater than 20 µm, it results in high film stress to reduce, in some cases, adhesion to the conductive layer 20.

The number of the through holes 26 (holes in the conductive layer 20 filled with the resin film 30) is not particularly limited and can be appropriately determined depending on the intended purpose. It is possible to increase the adhesion between the conductive layer 20 and resin film 30 when at least one such a through hole is formed. The greater the number of the through holes 26, the greater the adhesion between the conductive layer 20 and resin film 30. However, if the though holes 26 are formed in large numbers without any consideration, the area of the land part 24 needs to be larger than usual. For this reason, the number of the through holes 26 is preferably 2 to 5.

The shapes and sizes of the through holes 26, viewed from above a semiconductor substrate (silicon wafer 10) horizontally divided, may be identical or not. However, they are preferably identical to one another, because by doing so the conductive layer 20 and resin film 30 are bonded together in a balanced manner at the land part 24.

The shape of the through hole 26 viewed from above the semiconductor substrate (silicon wafer 10) horizontally divided is not particularly limited and can be appropriately determined depending on the intended purpose; examples of the cross sectional shape of the through hole 26 includes circular, ellipse, polygon, and the combinations thereof.

The positions where the through holes 26 are arranged are not particularly limited and can be appropriately determined depending on the intended purpose; they are preferably provided in the conductive layer 20 at least within a part of the land part 24. Moreover, for the purpose of forming an external terminal 40, they are preferably formed substantially at equal distances from the end 33 of the resin film 30 where the conductive layer 20 extends, and are substantially equally spaced from one another. In this case, the portions where the insulating film 12 and resin film 30 are bonded together are provided at appropriate positions in a balanced manner, thereby suppressing peeling off the resin film 30 at the land part 24 with more reliability.

Hereinafter, an example of a method for manufacturing the semiconductor device according to the First Example of the present invention shown in FIGS. 1A and 1B will be described with reference to the drawings.

Figure 2A:
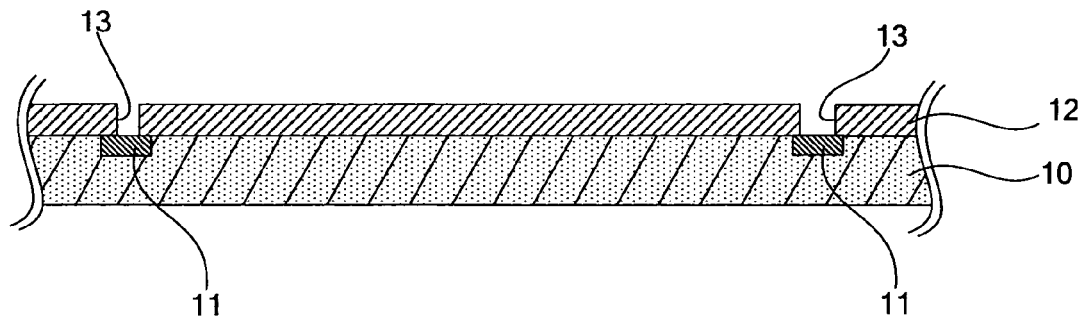
FIG. 2A is a first view for explaining a process in an example (First Example) of a method of the present invention for manufacturing the semiconductor device.

As shown in FIG. 2A, polyimide resin is first applied onto the silicon wafer 10, or the foregoing semiconductor substrate, having the Al pads 11 that serve as electrodes, and the applied polyimide resin is then uniformly spread over the surface of the silicon wafer 10 by spin coating, followed by exposure, development, and curing for the formation of the insulating film 12. Here, the insulating film 12 is formed on the silicon wafer 10 while avoiding Al pads 11 areas on which the connection holes 13 are to be provided. This is the insulating film formation step employed in the method of the present invention for forming the semiconductor device.

Figure 2B:
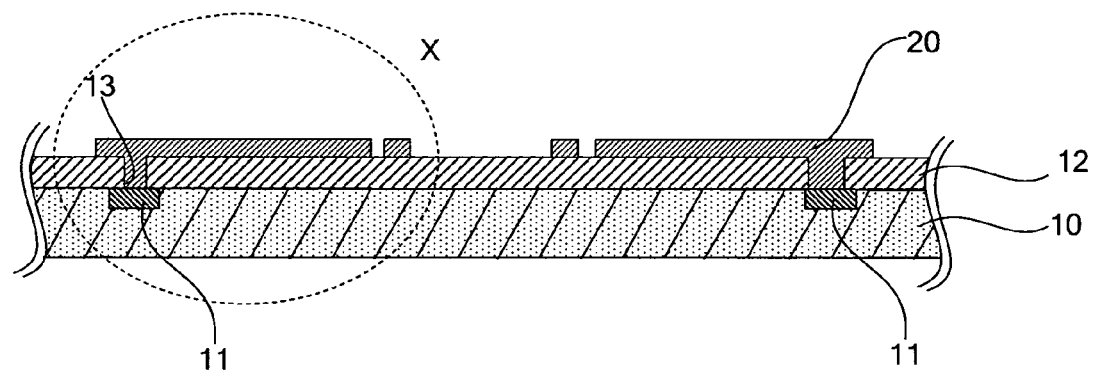
FIG. 2B is a second view for explaining the process in the example (First Example) of the method of the present invention for manufacturing the semiconductor device.
Figure 2C:
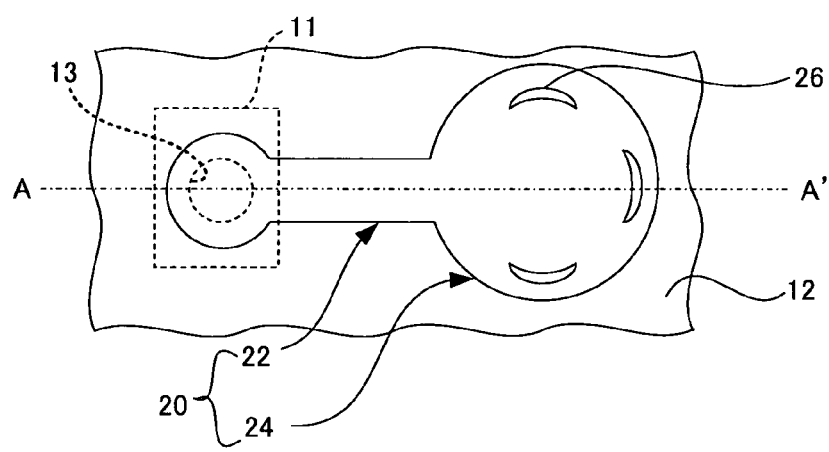
FIG. 2C is a third view for explaining the process in the example (First Example) of the method of the present invention for manufacturing the semiconductor device, showing the top view of "X" portion encircled by dotted line of FIG. 2B.

Next, a sputtering film is formed on the insulating film 12, and patterning is performed on the formed sputtering film using a resist, followed by electrolytic plating using Cu to thereby form the conductive layer 20 (or interconnection), covering both the surface of the insulating film 12 and inside the connection hole 13. In this way the Al pad 11 and the conductive layer 20 are connected together through the connection hole 13. FIG. 2C is a top view of "X" portion encircled by dotted line in FIG. 2B. Note that "X" portion in FIG. 2B corresponds to the cross section of "X" portion shown in FIG. 2C, taken along A-A' line. With the patterning process, the conductive layer 20 formed of the interconnection part 22 and land part 24 is formed on the insulating film 12, as shown in FIG. 2C. The interconnection part 22 and land part 24 can be simultaneously formed by forming the conductive layer 20. At this point, if the surface of the insulating film 12 is rendered flat, the interconnection part 22 and land part 24 are on the same plane. If the surface of the insulating film 12 is rendered irregular, the interconnection part 22 and land part 24 are formed on the insulating film 12 in such a way that they conform to this irregular surface. Inside the land part 24 area, a reticle pattern is provided with three desired shapes (crescent shape in FIG. 2C, viewed from above the silicon wafer 10 horizontally divided), which are not to be coated with plating. After removing the sputtering film by etching, three through holes 26 are formed in the conductive layer 20 at positions corresponding to the non-plated portions. The insulating film 12 is exposed through the through holes 26. Note in FIG. 2C that both the shapes and sizes of the through holes 26, viewed from above the silicon wafer 10 horizontally divided, are substantially identical. This is the conductive layer formation step employed in the method of the present invention for forming the semiconductor device.

Figure 3A:
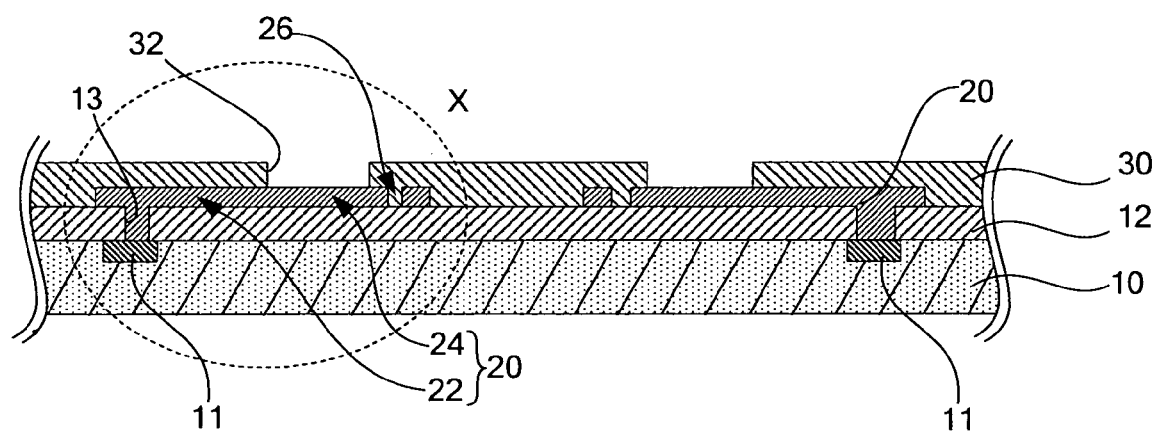
FIG. 3A is a fourth view for explaining the process in the example (First Example) of the method for manufacturing the semiconductor device of the present invention.
Figure 3B:
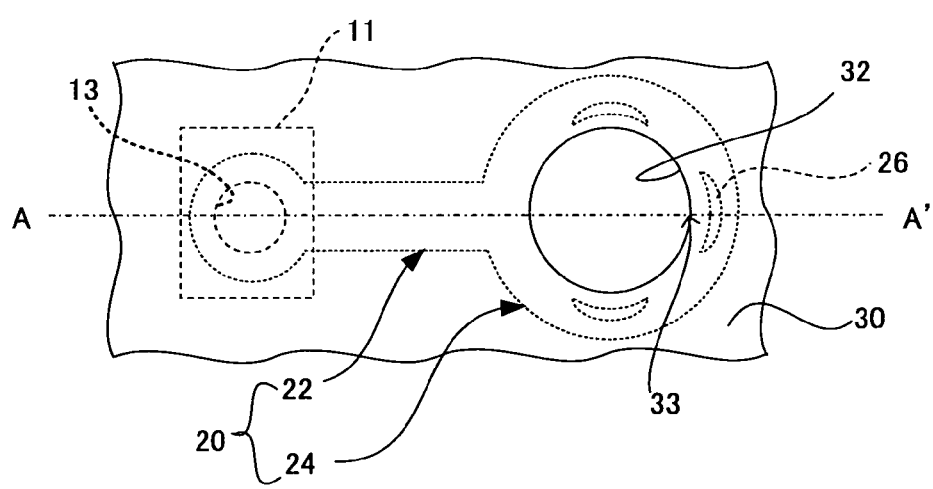
FIG. 3B is a view for explaining the process in the example (First Example) of the method of the present invention for manufacturing the semiconductor device, showing the top view of "X" portion encircled by dotted line of FIG. 3A.

Subsequently, with a photolithography method using polyimide resin, the resin film opening 32 is formed at least above the land part 24, and the resin film 30 is formed on the insulating film 12 and conductive layer 20, as shown in FIG. 3A. FIG. 3B is a top view of "X" portion encircled by dotted line in FIG. 3A. Note that "X" portion in FIG. 3A corresponds to the cross section of "X" portion shown in FIG. 3B, taken along A-A' line. As shown in FIGS. 3A and 3B, the resin film 30 enters the through holes 26, passing through the conductive layer 20 and contacting the insulating film 12 to firmly bonds to it. With this configuration, peeling off of the end 33 of the resin film 30 at the opening 32 provided above the land part 24 is prevented. Note also in FIG. 3B that the through holes 26 are arranged substantially at equal distances from the end of the exposing opening (or the end 33 of the resin film opening 32) which is present at least above a part of the conductive layer 20 within the land part 24.

This is the resin film formation step employed in the method of present invention for forming the semiconductor device.

Subsequently, the solder ball 40—the foregoing external terminal—is formed in the resin film opening 32 at the land part 24, and the external terminal (solder ball 40) and the interconnection part 22 are connected together at the land part 24. In addition, the interconnection part 22 and the Al pad (electrode) 11 are connected together, and electrical continuity is established between them. In this way the semiconductor device shown in FIGS. 1A and 1B can be manufactured.

Any known method can be adopted for the formation of the insulating film 12; examples of thereof include coating methods such as spin coating, roll coating, die coating, dip coating, gravure coating, curtain coating, spray coating and doctor blade coating; and printing method such as screen printing, spray printing, inkjet printing, surface printing, gravure printing and litho printing.

Various modifications can be made to the semiconductor device of the present invention as shown in Examples described below.

EXAMPLE 2

Figure 4A:
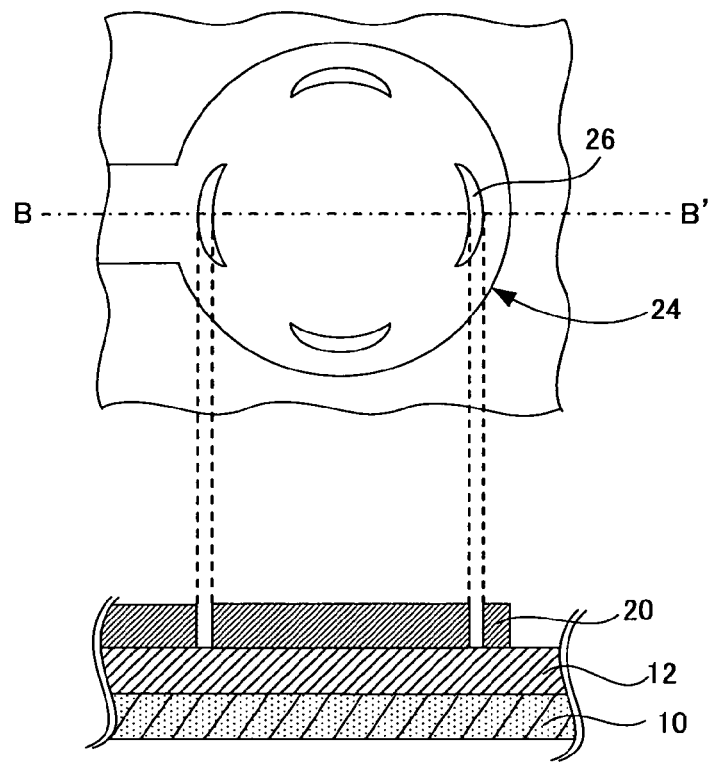
FIG. 4A is a schematic view showing the Second Example (Example 2) of the semiconductor device of the present invention.
Figure 4B:
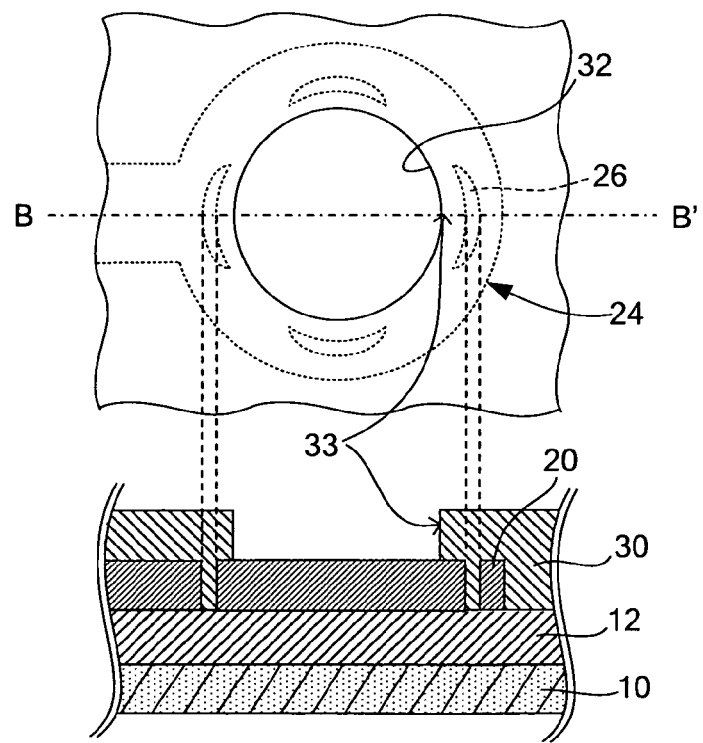
FIG. 4B is a schematic view showing an example of the arrangement of through holes provided above a land part in the Second Example (Example 2) of the semiconductor device of the present invention.

The Second Example of the semiconductor device of the present invention is shown in FIGS. 4A and 4B. In each drawing the upper side shows the top view of the semiconductor device and the lower side shows the cross-sectional view taken along B-B' line of the top view.

In the semiconductor device shown in FIG. 4A, there are provided four through holes 26 which are arranged substantially at equal distances from the end of the exposing opening (i.e., the end 33 of the resin film opening 32) present at least above a part of the conductive layer 20 within the land part 24, and are substantially equally spaced from one another.

Note that upon manufacturing of the semiconductor device shown in FIG. 4A, in the conductive layer formation step described above, the four through holes are formed in the conductive layer 20 in such a way that their shape, viewed from above the silicon wafer 10 horizontally divided, shows a substantially identical crescent shape and that their size is identical, as shown in FIG. 4B. Since the four through holes 26 are symmetrical about the center of the land part 24 in Example 2, the portions where the insulating film 12 and resin film 30 are bonded together are provided at appropriate positions in a balanced manner; therefore adhesion between them is increased compared to Example 1.

EXAMPLE 3

Figure 5:
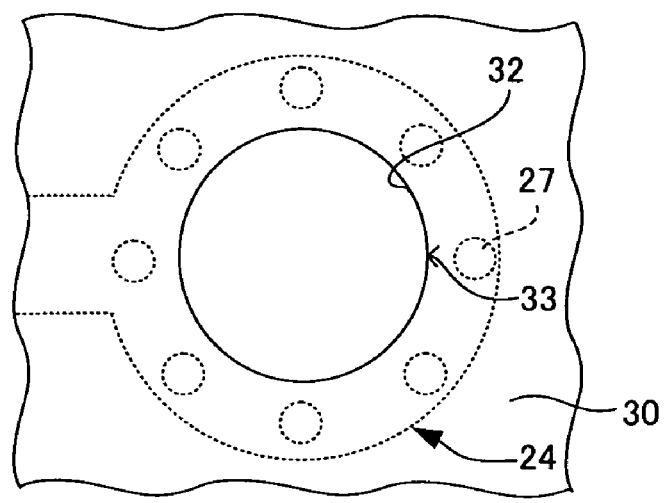
FIG. 5 is a schematic view showing an example of the arrangement of through holes provided above a land part in the Third Example (Example 3) of the semiconductor device of the present invention.

The Third Example of the semiconductor device of the present invention is shown in FIG. 5. FIG. 5 is a top view of a land part of the semiconductor device, showing the arrangement of through holes provided above the land part.

In Example 3 there are provided eight through holes 27 passing through the conductive layer 20, as shown in FIG. 5. The eight through holes 27 have substantially identical circular shapes when viewed from above the silicon wafer 10 horizontally divided, and their size is also substantially identical. Moreover, the eight through holes 27 are arranged substantially at equal distances from the end of the exposing opening (or the end 33 of the resin film opening 32) present at least above a part of the conductive layer 20 within the land 24 part, and are also substantially equally spaced from one another.

As described above, since the eight through holes 27 are symmetrical about the center of the land part 24 in Example 3, the portions where the insulating film 12 and resin film 30 are bonded together are provided in larger numbers at appropriate positions in a balanced manner. Thus, it is possible to suppress peeling off of the end 33 of the resin film 30 from the conductive layer 20 at the land part 24, thereby firmly securing the conductive layer 20 to the insulating film 12.

EXAMPLE 4

Figure 6:
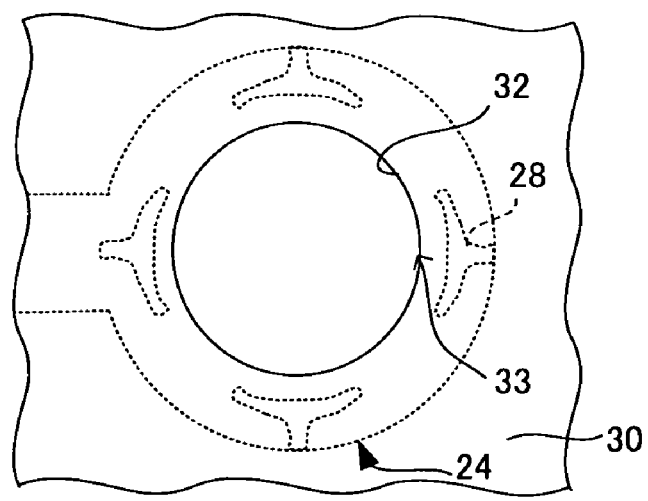
FIG. 6 is a schematic view showing an example of the arrangement of through holes provided above a land part in the Fourth Example (Example 4) of the semiconductor device of the present invention.

The Fourth Example of the semiconductor device of the present invention is shown in FIG. 6. FIG. 6 is a top view of a land part of the semiconductor device, showing the arrangement of through holes provided inside the area of the land part.

In Example 4 there are provided four through holes 28 passing through the conductive layer 20, as shown in FIG. 6. The four through holes 28 have substantially identical T shapes when viewed from above the silicon wafer 10 horizontally divided, and their size is also substantially identical. Moreover, the four through holes 28 are arranged substantially at equal distances from the end of the exposing opening (or the end 33 of the resin film opening 32) present at least above a part of the conductive layer 20 within the land 24 part, and are also substantially equally spaced from one another.

EXAMPLE 5

Figure 7A:
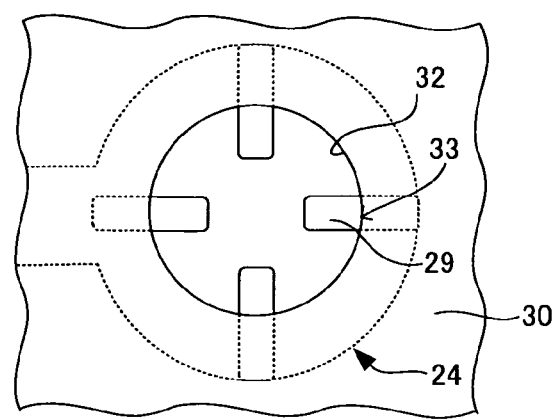
FIG. 7A is a schematic view showing an example of the arrangement of through holes provided above a land part in the Fifth example (Example 5) of the semiconductor device of the present invention.

The Fifth Example of the semiconductor device of the present invention is shown in FIG. 7A. FIG. 7A is a top view of a land part of the semiconductor device, showing the arrangement of through holes provided inside area of the land part.

In Example 5 there are provided four through holes 29 passing through the conductive layer 20, as shown in FIG. 7A. The four through holes 29 have substantially identical rectangular shapes when viewed from above the silicon wafer 10 horizontally divided, and their size is also substantially identical. Moreover, the four through holes 29 are arranged substantially at equal distances from the end of the exposing opening (or the end 33 of the resin film opening 32) present at least above a part of the conductive layer 20 within the land part 24, and are also substantially equally spaced from one another.

Figure 7B:
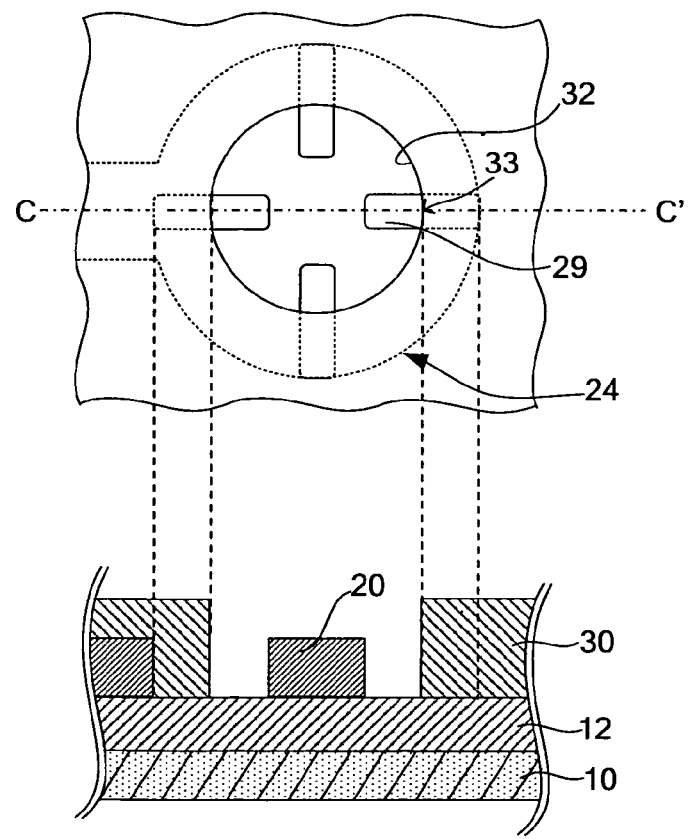
FIG. 7B is a first view showing a process in the Fifth example (Example 5) of the method of the present invention for manufacturing the semiconductor device, schematically showing the arrangement of through holes provided above a land part.
Figure 7C:
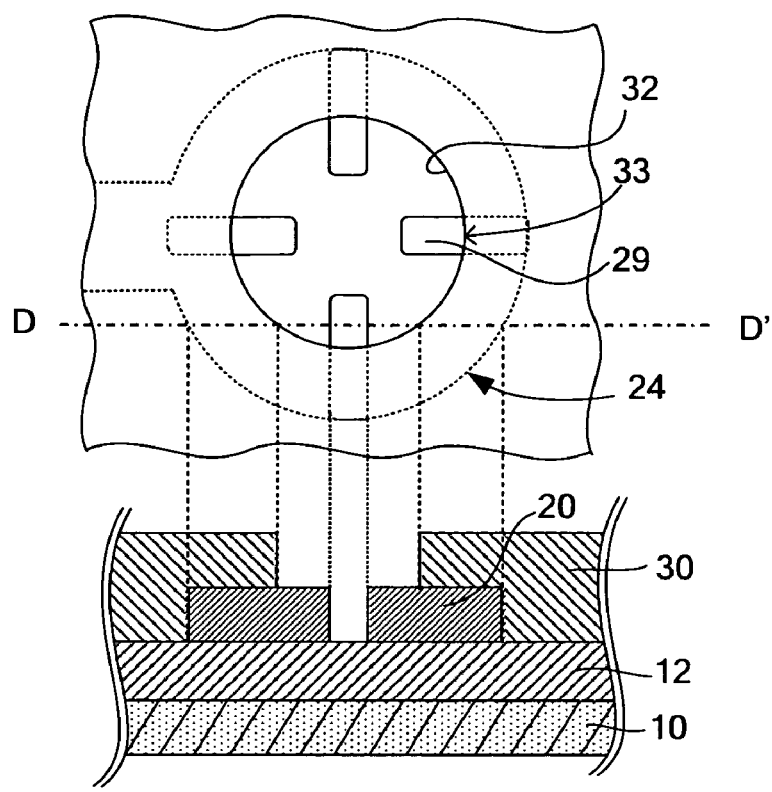
FIG. 7C is a first view showing the process in the Fifth Example (Example 5) of the method of the present invention for manufacturing the semiconductor device, schematically showing the arrangement of through holes provided above a land part.
Figure 7D:
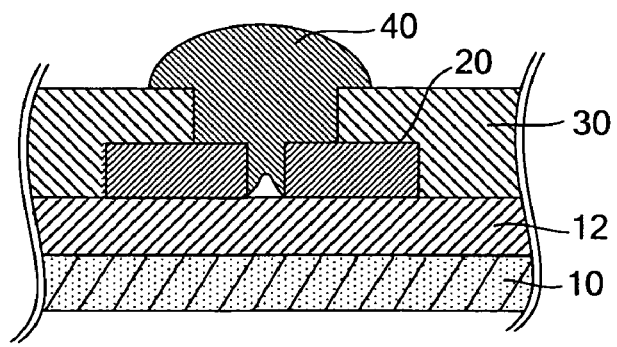
FIG. 7D is a second view showing the process in the Fifth example (Example 5) of the method of the present invention for manufacturing the semiconductor device.

In addition, an example of the method for manufacturing the semiconductor device shown in FIG. 7A is shown in FIGS. 7B to 7D. Note in FIGS. 7B and 7C that the upper side shows the top view of the semiconductor device, the lower side of FIG. 7B shows the cross-sectional view taken along C-C' line of the top view, and the lower side of FIG. 7C shows the cross-sectional view taken along D-D' line of the top view.

In Example 5 the through holes 29 are formed in such a way that they extend inside the resin film opening 32, where the resin film 30 is not formed, as shown in FIGS. 7B and 7C. Subsequently, the solder ball 40 is formed in the resin film opening 32 at the land part 24 as shown in FIG. 7D. With this configuration, a part of each through hole 29 formed in the conductive layer 20 above the land 24 is also filled with solder, covering the side surfaces of the conductive layer 20 in each through hole 29, thus increasing the bonding strength between the insulating film 12 and conductive layer 20.

In Example 5 it is possible to increase the adhesion between the conductive layer 20 and insulating film 12 by forming the through holes 29 inside the resin film opening 32, where the resin film 30 is not provided, because in doing so solder enters the through holes 29 inside the resin film opening 32.

Figure 8:
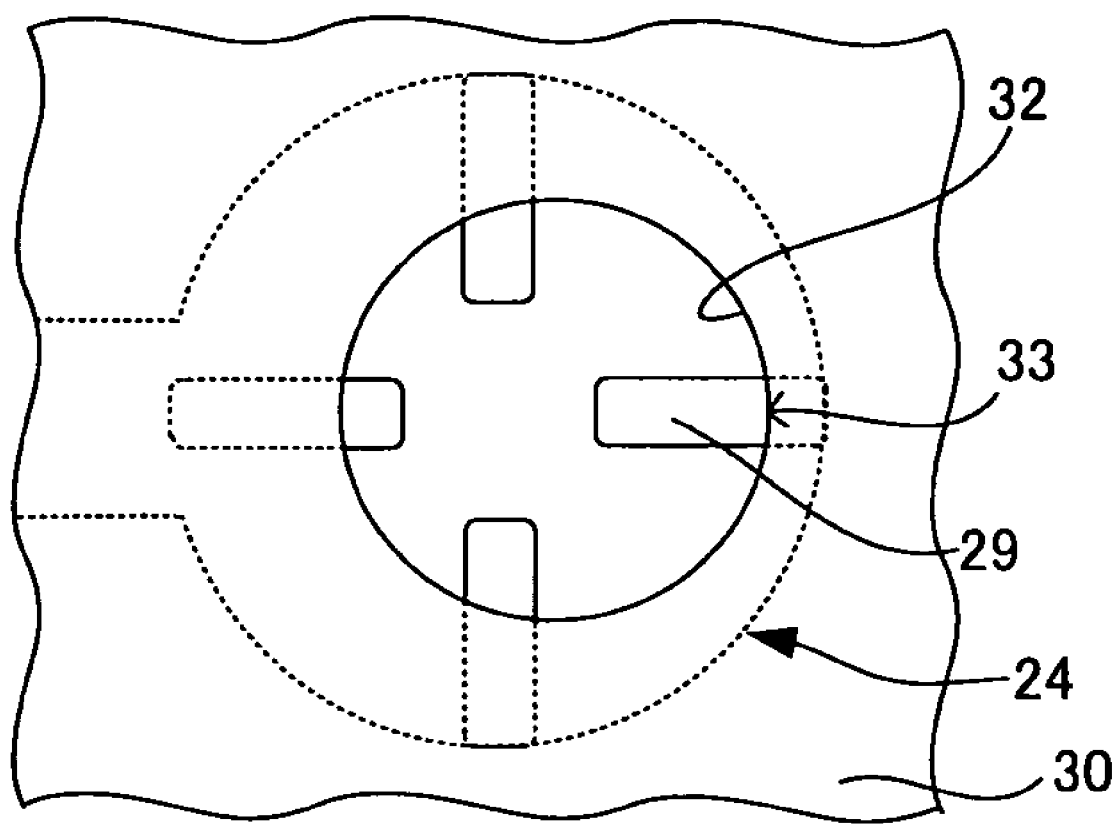
FIG. 8 is a schematic view showing an example of the arrangement of through holes provided above a land part in the Fifth example (Example 5) of the semiconductor device of the present invention.

Note that the center of the resin film opening 32 may be deviated from the center of the land part 24 as shown in FIG. 8. Also in this case, solder enters a part of each through hole 29 formed in the conductive layer 20 above the land part 24, covering the side surfaces of the conductive layer 20 inside each through hole 29 to thereby increase the bonding strength between the insulating film 12 and resin film 30. Thus, it is possible to increase the adhesion between the insulating film 12 and conductive layer 20.

Figure 9A:
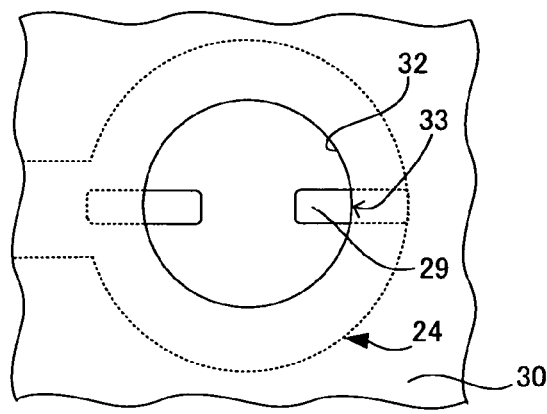
FIG. 9A is a schematic view showing an example of the arrangement of through holes provided above a land part in a modified example of the Fifth example of the semiconductor device of the present invention.
Figure 9B:
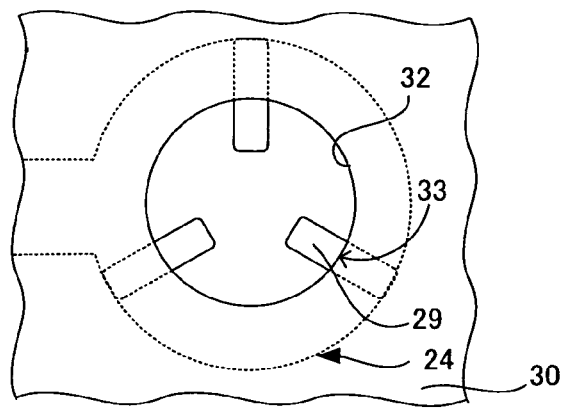
FIG. 9B is a schematic view showing an example of the arrangement of through holes provided above a land part in another modified example of the Fifth example of the semiconductor device of the present invention.
Figure 9C:
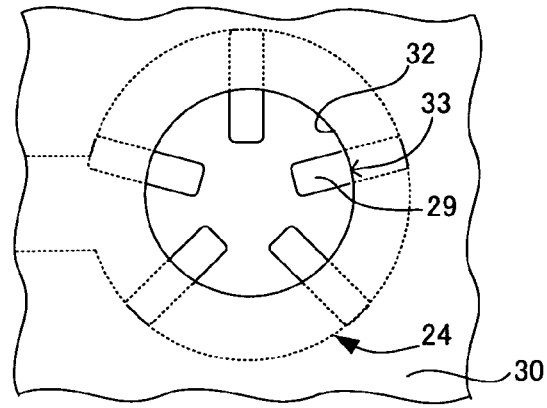
FIG. 9C is a schematic view showing an example of the arrangement of through holes provided above a land part in still another modified example of the Fifth example of the semiconductor device of the present invention.

The number of the through holes 29 to be provided can be appropriately determined. Appropriate modifications can be made to the semiconductor device of the present invention by changing the number of the through holes 29. For example, FIGS. 9A to 9C show other embodiments of the semiconductor device of the present invention, with the number of the through holes 29 being 2, 3, and 5, respectively. In FIGS. 9A to 9C the through holes 29 have substantially identical rectangular shapes when viewed from above the silicon wafer 10 horizontally divided, and their size is also substantially identical. Moreover, the through holes 29 are arranged substantially at equal distances from the end of the exposing opening (or the end 33 of the resin film opening 32) present at least above a part of the conductive layer 20 within the land part 24, and are substantially equally spaced from one another. The portions where the insulating film 12 and resin film 30 are bonded together are provided at appropriate positions in a balanced manner. Thus, it is possible to suppress peeling off of the end 33 of the resin film 30 from the conductive layer 20 at the opening 32 provided above the land part 24, thereby firmly securing the conductive layer 20 to the insulating film 12.

CONVENTIONAL EXAMPLES

Figure 10A:
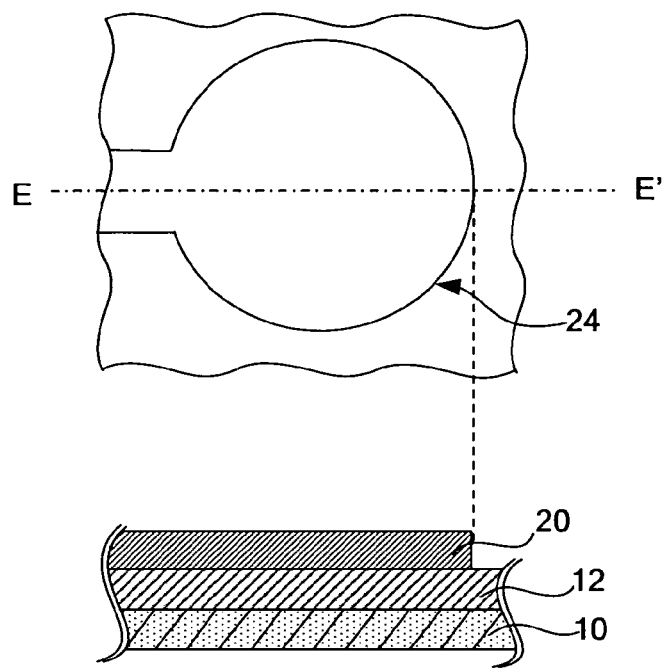
FIG. 10A is a schematic view showing a land part in a conventional semiconductor device.
Figure 10B:
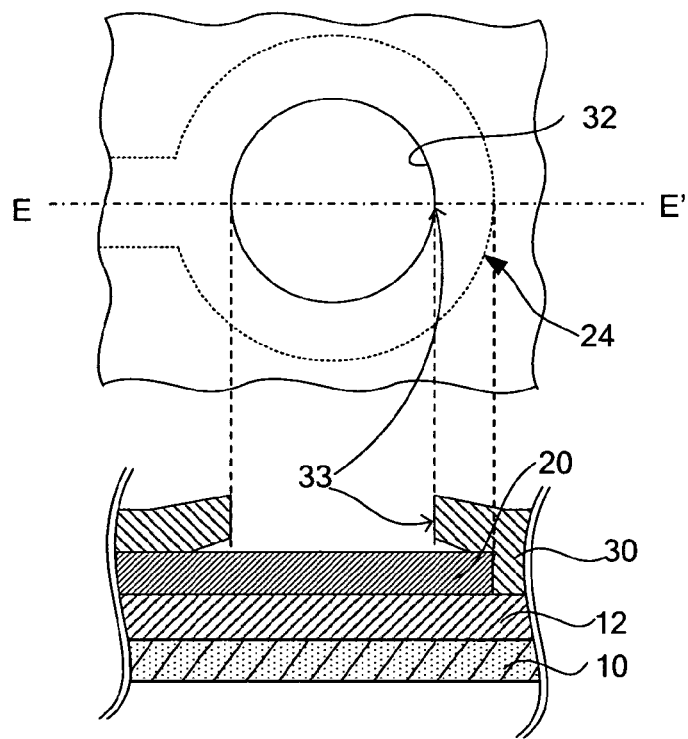
FIG. 10B is a schematic view showing a conventional semiconductor device.

FIGS. 10A and 10B show conventional wafer level packages. Note in FIGS. 10A and 10B that the upper side shows the top view of the semiconductor device and the lower side shows the cross-sectional view taken along E-E' line of the top view.

Since there are no through holes in the conductive layer 20 of the conventional wafer level package shown in FIG. 10A, the end 33 of the resin film 30 is peeled off from the conductive layer 20 at the opening 32 as shown in FIG. 10B, which is caused due to insufficient adhesion between the conductive layer 20 and resin film 30 formed. As a result, the bonding strength of the conductive layer 20 to the insulating film 12 is reduced, thereby making the conductive layer 20 wobbly.

According to the present invention, it is possible to solve the conventional problems and to provide a semiconductor device with high performance and reliability, in which peeling off an interconnection layer caused due to peeling off of a resin film at a land part is suppressed and thus electrical breakdown is prevented, and a method for manufacturing the semiconductor device.

The semiconductor device of the present invention is of high performance and reliability because it suppresses peeling off of an interconnection layer caused due to peeling off of a resin film at a land part. Thus, the semiconductor device of the present invention is particularly suitable for wafer level packages.

The method of the present invention for manufacturing a semiconductor device is suitable for the manufacturing of various semiconductor devices including wafer level packages, particular for the manufacturing of the semiconductor device of the present invention.

What is claimed is:

1. A semiconductor device, comprising:
   a semiconductor substrate;
   an insulating film formed on the semiconductor substrate;
   a conductive layer formed on the insulating film, the conductive layer formed of an interconnection part and a land part which connects the interconnection part to an external terminal; and
   a resin film covering the conductive layer,
   wherein the land part has one or more through holes and the resin film is in contact with the insulating film at least at a part of the land part by passing through the through holes.

2. The semiconductor device according to claim 1, wherein the number of the through holes is 2 to 5.

3. The semiconductor device according to claim 2, wherein the shapes and sizes of the through holes, viewed from above the semiconductor substrate horizontally divided, are substantially identical.

4. The semiconductor device according to claim 2, wherein at least a part of the conductive layer within the land part is exposed from the resin film, the through holes are arranged substantially at equal distances from the end of the resin film from which the conductive layer is exposed, and the through holes are substantially equally spaced.

5. The semiconductor device according to claim 1, wherein the resin film has insulation properties, and the conductive layer is made of metal.

6. The semiconductor device according to claim 5, wherein the metal is copper.

7. The semiconductor device according to claim 1, wherein the material for the insulating film is at least one selected from the group consisting of polyimide resins, polyamide resins, epoxy resins, polybenzoxazole resins and benzocyclobutene resins.

8. The semiconductor device according to claim 1, wherein the material for the resin film is at least one selected from the group consisting of polyimide resins, polyamide resins, epoxy resins, polybenzoxazole resins and benzocyclobutene resins.

9. The semiconductor device according to claim 1, wherein the insulating film is made of the same material as the resin film.

10. A method for manufacturing a semiconductor device, comprising:
    forming an insulating film on a semiconductor substrate;
    forming a conductive layer on the semiconductor substrate, the conductive layer formed of an interconnection part and a land part which connects the interconnection part to an external terminal;
    forming through holes in the conductive layer at least within a part of the land part; and
    forming a resin film on the conductive layer in such a way that the resin film passes through the through holes to thereby allow the insulating layer to contact the resin film.

11. The method for manufacturing a semiconductor device according to claim 10, wherein the number of the through holes is 2 to 5.

12. The method for manufacturing a semiconductor device according to claim 10, wherein the shapes and sizes of the through holes, viewed from above the semiconductor substrate horizontally divided, are substantially identical.

13. The method for manufacturing a semiconductor device according to claim 10, wherein at least a part of the conductive layer within the land part is exposed from the resin film, the through holes are arranged substantially at equal distances from the end of the resin film from which the conductive layer is exposed, and the through holes are substantially equally spaced.

14. The method for manufacturing a semiconductor device according to claim 10, wherein the resin film has insulation properties, and the conductive layer is made of metal.

15. The method for manufacturing a semiconductor device according to claim 14, wherein the metal is copper.

16. The method for manufacturing a semiconductor device according to claim 10, wherein the material for the insulating film is at least one selected from the group consisting of polyimide resins, polyamide resins, epoxy resins, polybenzoxazole resins and benzocyclobutene resins.

17. The method for manufacturing a semiconductor device according to claim 10, wherein the material for the resin film is at least one selected from the group consisting of polyimide resins, polyamide resins, epoxy resins, polybenzoxazole resins and benzocyclobutene resins.

18. The method for manufacturing a semiconductor device according to claim 10, wherein the insulating film is made of the same material as the resin film.

* * * * *